(12) United States Patent
van Antwerpen et al.

(10) Patent No.: US 7,441,212 B1
(45) Date of Patent: Oct. 21, 2008

(54) STATE MACHINE RECOGNITION AND OPTIMIZATION

(75) Inventors: Babette van Antwerpen, Mountain View, CA (US); Gregg William Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 392 days.

(21) Appl. No.: 11/222,090

(22) Filed: Sep. 7, 2005

(51) Int. Cl.
*G06F 17/50* (2006.01)
(52) U.S. Cl. ............... 716/4; 716/5; 716/16; 716/18
(58) Field of Classification Search ........... 716/2–5, 716/16–18
See application file for complete search history.

(56) References Cited

U.S. PATENT DOCUMENTS

| | | | | |
|---|---|---|---|---|
| 6,016,526 A | * | 1/2000 | Arimilli et al. | 710/105 |
| 6,735,743 B1 | * | 5/2004 | McElvain | 716/4 |
| 6,958,625 B1 | * | 10/2005 | Ramsden | 326/46 |
| 2002/0023256 A1 | * | 2/2002 | Seawright | 716/18 |
| 2005/0268070 A1 | * | 12/2005 | Baxter | 711/203 |

* cited by examiner

*Primary Examiner*—Paul Dinh
(74) *Attorney, Agent, or Firm*—Townsend and Townsend and Crew LLP (57) ABSTRACT

State machines are identified from a netlist of circuit elements of a user design. Strongly connected components in the netlist are identified as candidates for analysis. The registers of each strongly connected component are identified. An optimal set of inputs and potential state transition logic is identified for the registers in the component. A set of reachable states from an initial state of the registers of a component is determined by simulating state transitions in response to permutations of input values. State machine information is created to assist compilation software in optimizing the user design. Optimizations can include identifying redundant circuit elements based on the set of reachable states and reencoding the state machine with a different state encoding scheme to reduce the amount of state transition and output logic. A subset of the set of reachable states representing a one-hot encoded state machine may be further isolated and optimized.

36 Claims, 11 Drawing Sheets

STATE MACHINE RECOGNITION AND OPTIMIZATION

BACKGROUND OF THE INVENTION

The present invention relates to the field of programmable devices, and the systems and methods for programming the same. Programmable devices, such as FPGAs, typically includes thousands of programmable logic cells that use combinations of logic gates and/or look-up tables to perform a logic operation. Programmable devices also include a number of functional blocks having specialized logic devices adapted to specific logic operations, such as adders, multiply and accumulate circuits, phase-locked loops, and memory. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

A typical compilation process for determining the configuration of a programmable device, referred to compilation, starts with an extraction phase, followed by a logic synthesis phase, a technology mapping phase, a fitting phase, and an assembly phase. The extraction phase takes a user design, typically expressed as a netlist in a hardware description language such as Verilog or VHDL, and produces a set of logic gates implementing the user design. In the logic synthesis phase, operators such as multiplexers, decoders, adders, and other circuit elements are transformed into logic gates or logic cells. The logic synthesis phase also minimizes the set of logic gates or logic cells to meet design goals such as area or resource usage, operating speed, or power consumption. In the technology mapping phase, the set of logic gates is permuted over the hardware architecture of the programmable device in order to match elements of the user design with corresponding portions of the programmable device. The fitting phase assigns the various portions of the user design to specific logic cells and functional blocks (sometimes referred to as placement) and determines the configuration of the configurable switching circuit used to route signals between these logic cells and functional blocks (sometimes referred to as routing), taking care to satisfy the user timing constraints as much as possible. In the assembly phase, a configuration file defining the programmable device configuration implementing the user design is created. The programmable device configuration can then be loaded into a programmable device to implement the user design. Programmable devices can be configured with the configuration during or after manufacturing.

Finite state machines, commonly referred to as state machines, are widely used in user designs for a variety of purposes, including controlling sequences of actions. A state machine is a model of behavior comprising states and transitions. A state represents the sequence of inputs to the state machine from its start to the present moment. A transition specifies a change in state from the current state, often, though not necessarily, as a result of one or more inputs received. In hardware, state machines are typically implemented as registers to store state variables and combinatorial logic gates to implement transitions and state machine outputs.

Many hardware description languages enable designers to specify state machines directly as a set of states and transitions, rather than as registers, combinatorial logic gates, and connecting wires. The compilation process, often in the extraction and synthesis phases, then converts the state machine description into a corresponding set of registers, combinatorial logic, and connecting wires. Because the states of the state machine are explicitly defined, the compilation software only has to create combinatorial logic and registers corresponding the defined states. As a result, the compilation process typically produces efficient hardware implementations of state machines.

Unfortunately, state machines are sometimes not recognized by the compilation software. This can occur when designers choose to specify the state machine as registers and combinatorial logic gates or when the state machine is not specified in a required format. When the compilation software does not recognize the state machine, it does not know which states are explicitly defined for the state machine and which states are undefined and will never be used. As a result, it must assume that all possible combinations of register values representing states may be used by the circuit, and the resulting hardware implementation is typically much less efficient.

It is therefore desirable for a system and method to identify state machines from the registers and combinatorial logic in user designs and automatically generate a state machine specification. It is further desirable for the system and method to enable optimizations of the hardware implementation of state machines identified in the user design.

BRIEF SUMMARY OF THE INVENTION

An embodiment of the invention identifies state machines from a netlist of circuit elements of a user design. Strongly connected components in the netlist are identified as candidates for analysis. The registers of each component are identified. An optimal set of inputs and potential state transition logic is identified in the component. A set of reachable states from an initial state of the registers of a component is determined by simulating state transitions in response to permutations of input values. State machine information is created to assist compilation software in optimizing the user design. Optimizations can include identifying redundant components based on the set of reachable states and reencoding the state machine with a different state encoding scheme to reduce the amount of state transition and output logic. A further embodiment searches for a subset of the set of reachable states representing a one-hot encoded state machine.

BRIEF DESCRIPTION OF THE DRAWINGS

The invention will be described with reference to the drawings, in which.

DETAILED DESCRIPTION OF THE INVENTION

Figure 1:
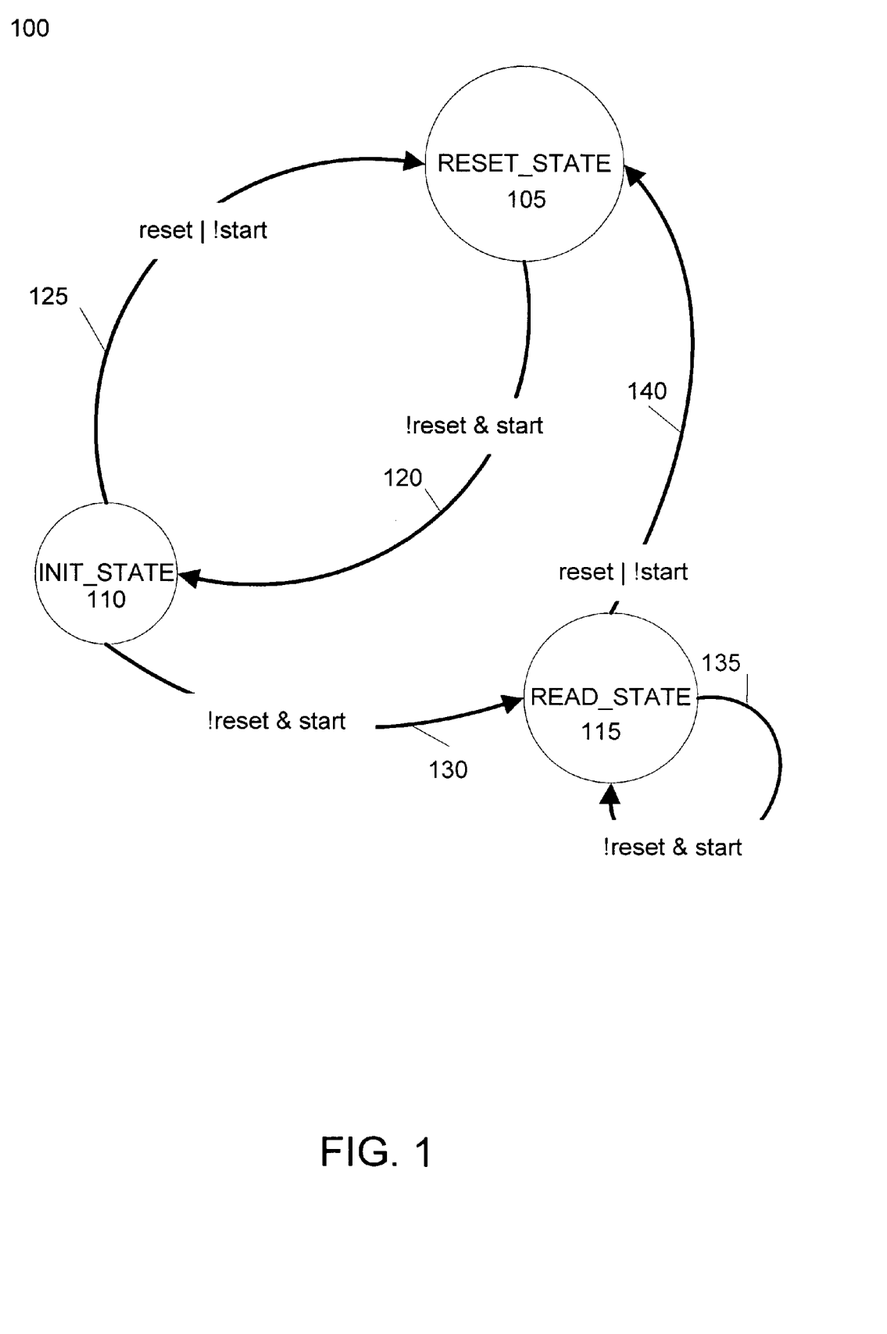
FIG. 1 is a state machine diagram illustrating the operation of an example state machine.

FIG. 1 is a state machine diagram illustrating the operation of an example state machine 100. State machine 100 includes three states: reset_state, 105; init_state, 110; and read_state, 115. State machine 100 includes transitions 120, 125, 130, 135, and 140. In this example, transitions between these states are controlled by Boolean expressions of two state machine inputs: reset and start. For example, the state machine 100 changes from reset_state 105 to init_state 110 when the reset input is 0 and the start input is 1. Although not shown in FIG. 1, the reset input may be asynchronous, so that the reset input can initiate a transition to the reset_state at any time, regardless of a clock signal. The other inputs can be synchronous, so that all other state transitions are synchronous with the clock signal.

When state machines are implemented in hardware, each state is associated a value in one or more registers, latches, flip-flops, or other devices capable of storing information. There are a variety of different encoding schemes known in the art for representing the states of a state machine. One of the most common is a binary encoding scheme in which a minimum number of register bits are used to represent each state as a binary number. One-hot encoding is another scheme of representing states of a state machine. In one-hot encoding, the present state of the state machine can be deduced from the value of only one register bit. Although one-hot encoding can require more register bits to implement a state machine, the requirements for combinatorial logic are often reduced. Embodiments of the invention can use either of these encoding schemes to represent the state machine, as well as any other encoding scheme known in the art.

Table 1 illustrates an example one-hot encoding representation of the states of state machine 100 discussed above.

TABLE 1

Example encoding of a state machine.

| | FFReset | FFInit | FFRead |
| --- | --- | --- | --- |
| Reset_State | 0 | 0 | 0 |
| Init_State | 1 | 1 | 0 |
| Read_State | 1 | 0 | 1 |

In the example encoding in Table 1, three flip-flops are used to represent the three states of the state machine 100. The current state of the state machine 100 can be deduced from the value of one flip-flop. For example, when the state machine 100 is in reset_state 105, the value of the flip-flop FFReset is 0. For all other states, this flip-flop has a value of 1. Similarly, the Init_State is signified by a 1 value in the FFInit flip-flop, and the Read_State is signified by a 1 value in the FFRead flip-flop.

The state machine 100 can be specified using a hardware description language, such as Verilog. Table 2 illustrates example Verilog code specifying the state machine 100 shown in FIG. 1.

TABLE 2

Example Verilog code for a state machine

```
module sm_for_patent
(
    clk,
    reset,
```

TABLE 2-continued

Example Verilog code for a state machine

```
    start,
    do_read
);
input clk, reset, start;
output    do_read;
// Wire Declaration
wire clk;
wire reset;
wire start;
reg do_read;
parameter StateReset = 2'b00, StateInit = 2'b01, StateRead = 2'b10;
reg [2:0] state;
always @ (posedge clk or posedge reset)
begin
    if (reset)
        state <= StateReset;
    else
        if (start)
        begin
            case (state)
                StateReset:
                    state <= StateInit;
                StateInit:
                    state <= StateRead;
                StateRead:
                    state <= StateRead;
            endcase
        end
        else
            state <= StateReset;
end
always @ (state)
begin
    case (state)
        StateReset:
        begin
            do_read = 1'b0;
        end
        StateInit:
        begin
            do_read = 1'b0;
        end
        StateRead:
        begin
            do_read = 1'b1;
        end
    endcase
end
endmodule
```

Figure 2A:
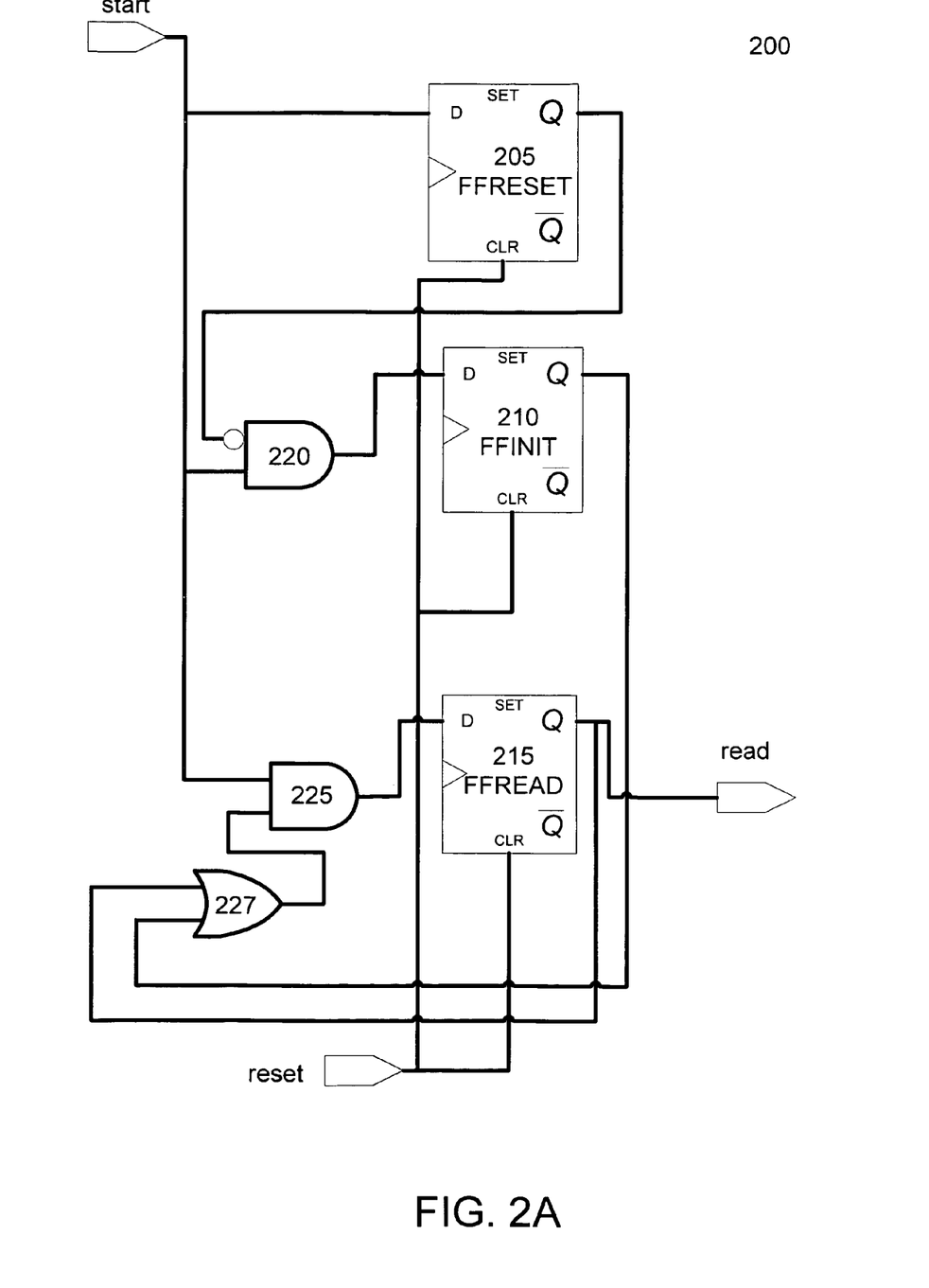
FIGS. 2A-2B illustrate circuit implementations of the example state machine of FIG. 1.

Compilation software can often correctly recognize a state machine specified in a hardware description language and automatically generate an efficient hardware implementation. FIG. 2A illustrates a example hardware implementation 200 of the state machine 100. In hardware implementation 200, the state machine 100 is implemented with three flip-flops, 205, 210, and 215, and three logic gates, 220, 225, and 227.

As discussed above, state machines are sometimes not recognized by the compilation software. This can occur due to the designer not following specific coding standards, or when designers choose to specify the state machine as registers and combinatorial logic gates. For example, if the user design specification directly references the value of a register used by a state machine, some compilation software will not recognize the state machine. It should be noted that compilation software can fail to recognize state machines for a variety of different reasons, and that embodiments of the invention are applicable in any circumstance where state machines defined in a user design are not recognized or where further optimizations of state machines in the user design are possible during the compilation process.

Figure 2B:
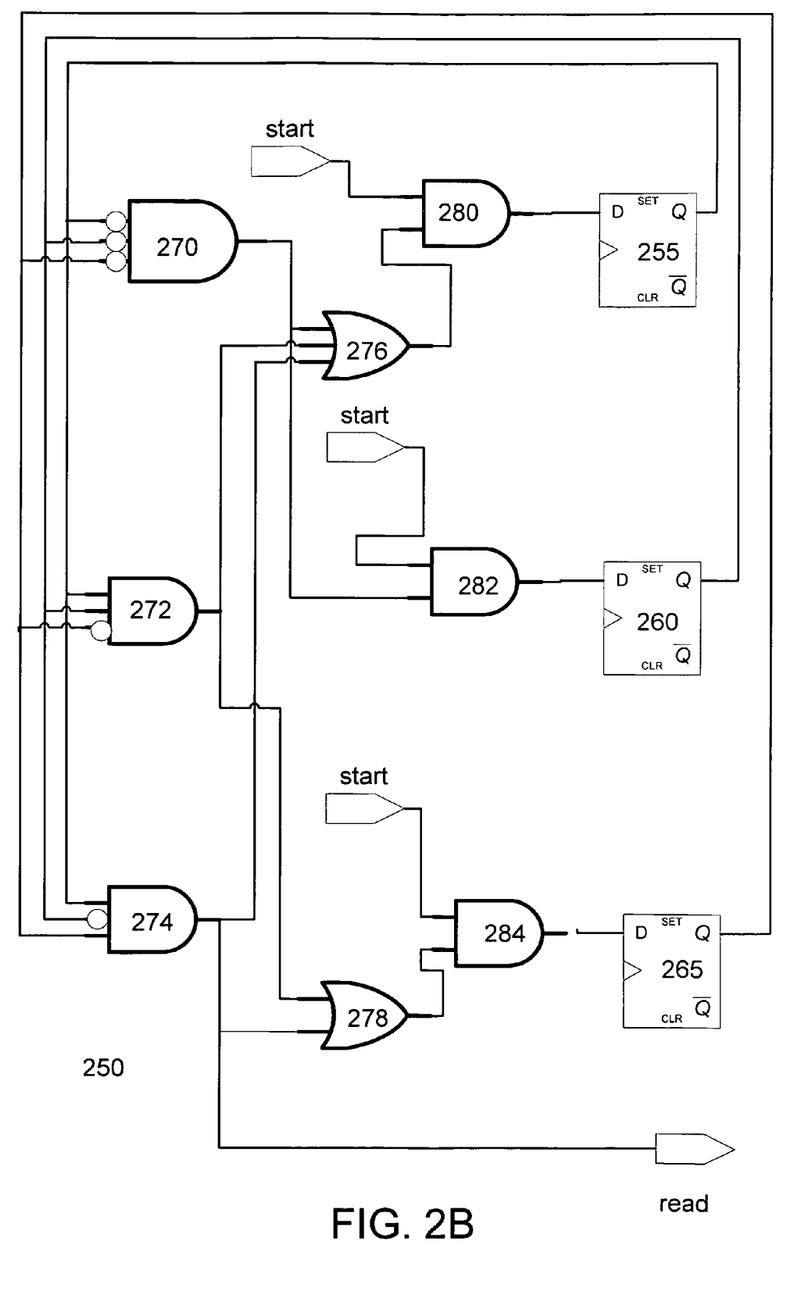

If the compilation software does not recognize a state machine defined in the specification of a user design, the compilation software typically assumes that all possible register values can occur. This can lead to inefficient hardware implementations of the state machine. FIG. 2B is another example hardware implementation 250 of the state machine 100. In hardware implementation 250, the state machine 100 is implemented with three flip-flops, 255, 260, and 265, and eight logic gates, 270, 272, 274, 276, 278, 280, 282, and 284. For clarity, the reset input, connected to the CLR input of each flip-flop, is omitted from FIG. 2. Although hardware implementations 200 and 250 both implement the same state machine 100, it can be seen that implementation 200, requiring six fewer logic gates, is a far more efficient implementation, both in terms of hardware resources required and of a faster operating speed.

The state machine 100 of FIG. 1 and its state encoding, example source code, and hardware implementations in FIGS. 2A-2B are discussed for the purpose of providing context to embodiments of the invention and should not be considered limitations of the scope of the invention. Embodiments of the invention are applicable to state machines and hardware implementations thereof of much greater complexity. Furthermore, the embodiments of the invention are capable of working with state machines specified using any hardware description language or other system of describing the functional characteristics or configuration of a circuit.

Figure 3A:
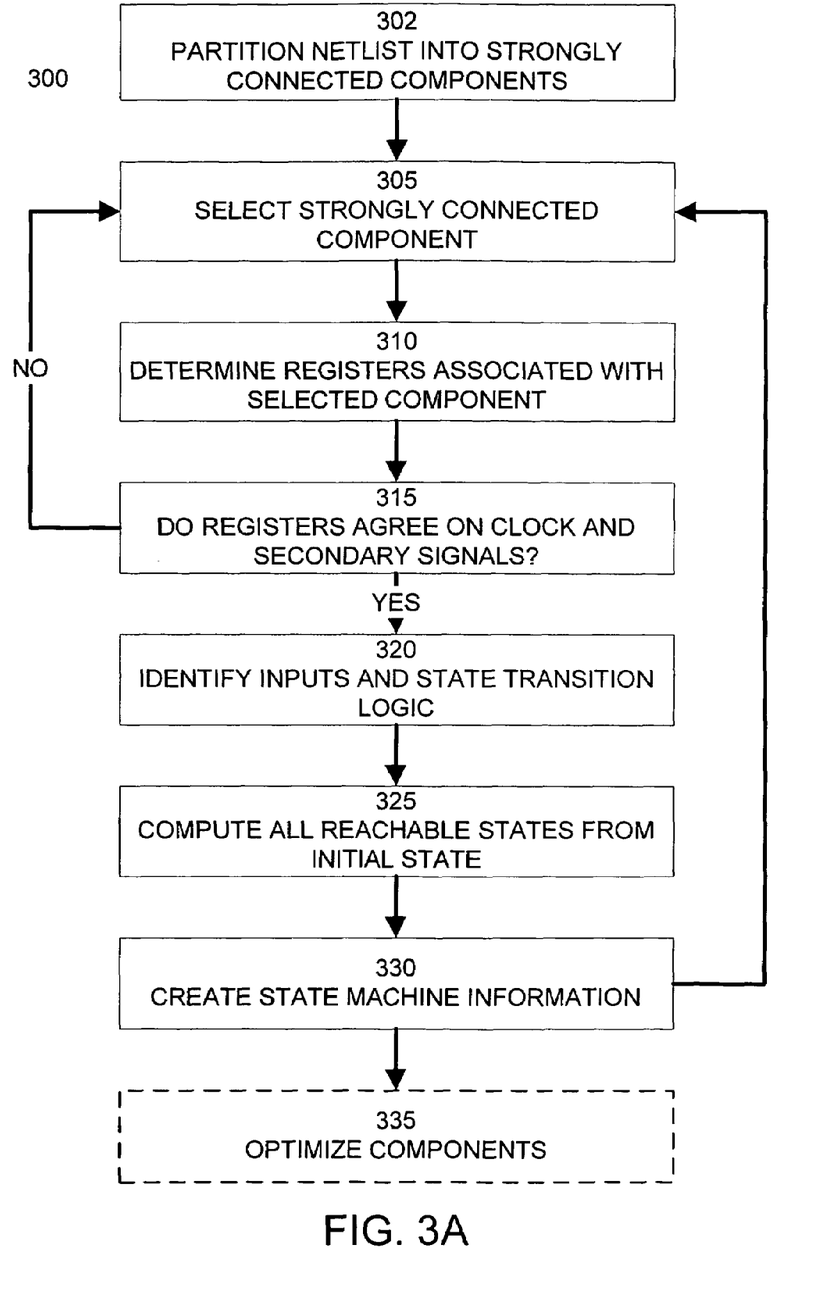
FIGS. 3A-3B are flowcharts illustrating methods of recognizing and optimizing state machines in a netlist of a user design according to an embodiment of the invention.

FIG. 3A is a flowchart illustrating a method 300 of recognizing and optimizing state machines in a netlist of a user design according to an embodiment of the invention. In an embodiment, method 300 receives a netlist specifying the elements of a circuit and their connections. Elements can include combinatorial logic gates, registers, flip-flops, and specialized functional blocks such as adders, multiply and accumulate (MAC) units, memory, and input and output interfaces. Method 300 then attempts to recognize any state machines in the netlist from the types of elements and their connections. In an embodiment, state machines in the netlist may arise when previous phases of the compilation software do not recognize state machines explicitly defined by the user. In other embodiments, state machines may also exist in the netlist when previous compilation phases do recognize a state machine defined by the user, but the compilation software wishes to further optimize the elements comprising the state machine.

In an embodiment, the netlist of a user design is represented as a directed graph comprising graph nodes, which correspond to the elements of the circuit, and connections, which correspond to the wires between elements of the circuit. In a directed graph, each connection specifies a one-way relationship between nodes.

Step 302 finds strongly connected components in the netlist. A component is a set of connected graph nodes in a directed graph. A strongly connected component is a set of graph nodes in the directed graph in which there is a two-way connection, either directly or indirectly, between all of the graph nodes. For example, a pair of graph nodes can be a strongly connected component if there are two one-way connections in opposite directions between them. In an additional example, three or more graph nodes are strongly connected if there exists a loop or path from each of nodes back to itself.

Figure 4:
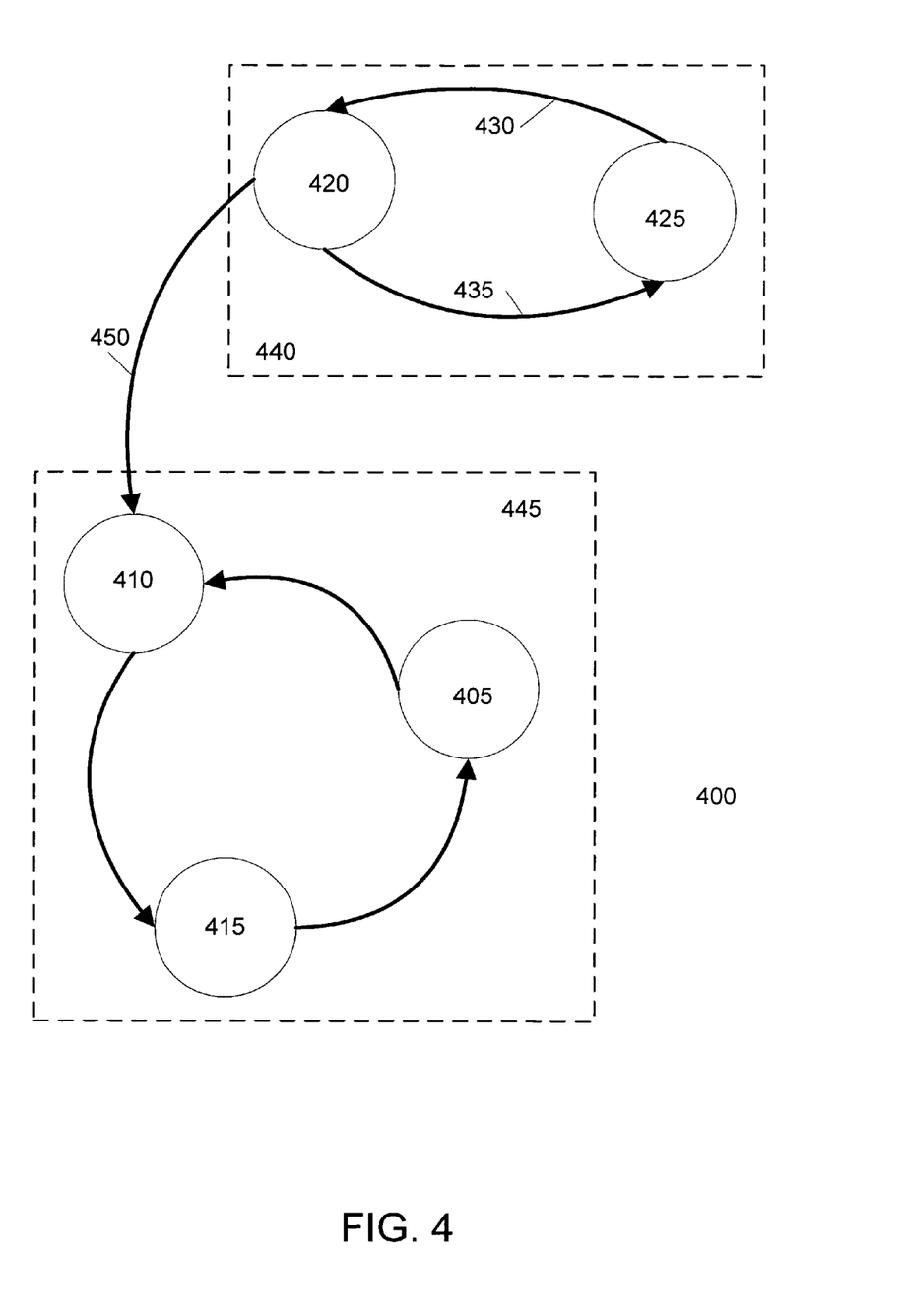
FIG. 4 illustrates an example of strongly connected components suitable for use with an embodiment of the invention.

FIG. 4 illustrates an example 400 of strongly connected components. Nodes 420 and 425 are strongly connected because of the two one-way connections, 430 and 435, between them. Thus, components 420 and 425 form a strongly connected component 440. Similarly, components 405, 410, and 415 form a strongly connected component 445. In this example, note that the strongly connected components 440 and 445 cannot be combined into a single larger strongly connected component, because connection 450 is only one-way.

Returning to method 300, an embodiment of step 302 attempts to include as many nodes or circuit elements as possible within a strongly connected component. If step 302 cannot find at least one strongly connected component in the netlist, method 300 terminates. Step 302 can identify strongly connected components in a directed graph using techniques well known to those of ordinary skill in the art.

Step 305 selects one of the strongly connected components identified by step 302. Step 310 identifies all of the registers in the selected strongly connected component. Step 315 examines the set of registers identified in step 310 to determine if they share the same clock and secondary signals, such as asynchronous clear, set, and/or load inputs. If the registers in the strongly connected component do not have a common clock or secondary signals, method 300 cannot attempt to identify a state machine in this group. As a result, step 315 returns to step 305 to select another strongly connected component, if possible.

Conversely, if the registers of the selected strongly connected component do share common clock and secondary signals, method 300 proceeds to step 320. Step 320 identifies potential state machine inputs and the state transition logic, which is the combinatorial logic implementing the set of transitions of the state machine. In an embodiment, step 320 uses a minimum cut algorithm to identify the potential state machine inputs and state transition logic. In a further embodiment, if the number of potential state machine inputs exceeds a threshold value, method 300 aborts its analysis of the selected strongly connected component and returns to step 305 to select another strongly connected component in the netlist, if any more exist. The threshold value can be used to limit the number of potential state machine inputs to decrease the computational resources and execution time required by method 300.

Figure 5:
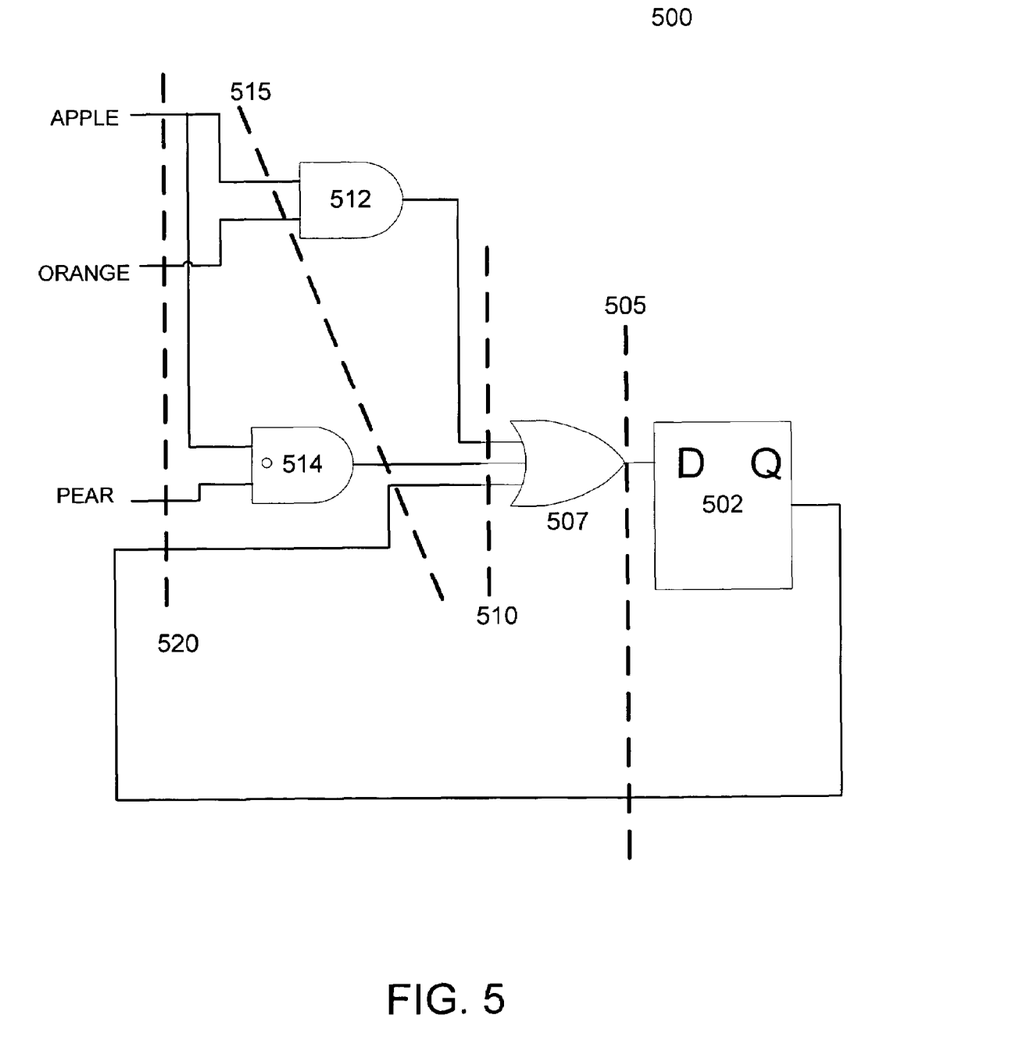
FIG. 5 illustrates a set of input cuts of an example circuit suitable for use with an embodiment of the invention.

FIG. 5 illustrates a set of example cuts corresponding to different input sets in an example user design 500, in which the state machine consists of only one register 502. Each cut is a set of outputs of components, such that removing the connections from these component outputs will disconnect the inputs APPLE, ORANGE and PEAR and the output of 502 from the input of 502. The size of a cut is the number of outputs of components in the cut. For example, cut 505 contains the output of gate 507 and register 502 and has size two. Cut 510 contains the outputs of gates 512 and 514 and register 502 and has size three. Cut 515 contains the outputs of pins APPLE, ORANGE, gate 514 and register 502. It has size four. Cut 520 also has size four: it contains the outputs of APPLE, ORANGE and PEAR, and register 502.

Step 320 uses a minimum cut algorithm to find a minimum size cut that separates the inputs of the registers from the outputs of the registers and other logic in the netlist. The minimum cut typically includes at least all of the register outputs. Any additional signals associated with the minimum cut are also considered potential state machine inputs. The state transition logic is defined as any nodes or circuit elements, such as logic gates, connected between the minimum cut and data input ports of the registers of the selected strongly connected component. Any nodes outside of the minimum cut, i.e. circuit elements that are part of the selected strongly connected component and are not between the minimum cut and the registers, are considered as part of the netlist of the user design in general, rather than part of a state machine within the user design. Other embodiments of step 320 can use other techniques to identify potential state machine inputs and state transition logic.

Using the set of inputs and state transition logic determined in step 320, step 325 determines all of the reachable states of the state machine. A reachable state is a set of register values that can be reached from a given initial set of register values, such as the state of the registers immediately following a system reset, and a sequence of input values. Typically, the number of reachable states is much less than the potential number of sets of register values, which often allows for substantial optimization of the hardware implementation of the state machine. Example state machine 100 has only three reachable states; however, when implemented with three registers, there are eight potential sets of register values.

Figure 6:
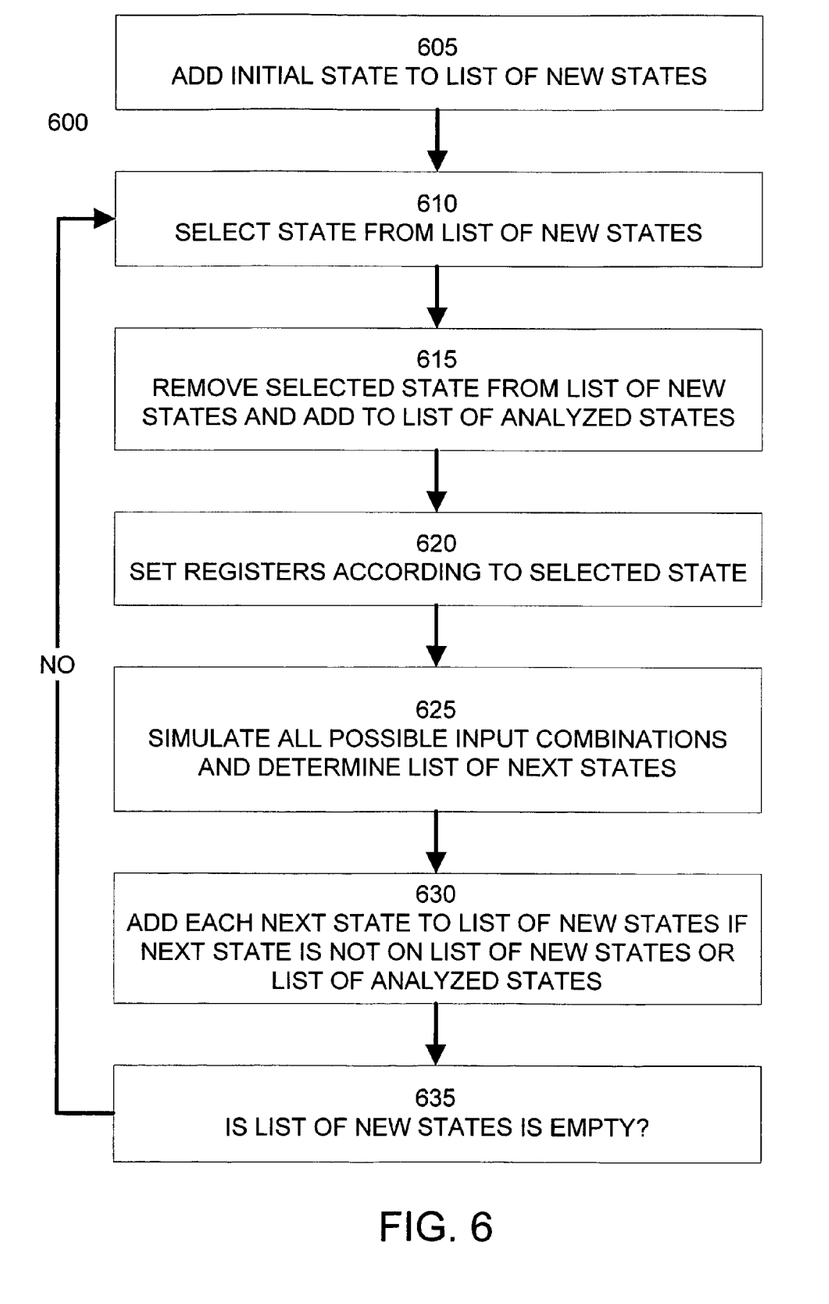
FIG. 6 illustrates a method of determining the states of a state machine according to an embodiment of the invention.

For each reachable state, step 325 records the set of register values associated with that state, the previous state and its register values, and the input values causing the transition between the previous state and the current state. The set of reachable states can be determined using any state machine analysis or simulation technique known in the art. Method 600, discussed below, is one such state machine analysis technique suitable for use with an embodiment of step 325. In a further embodiment, if the number of potential state machine inputs exceeds a threshold value, method 300 aborts its analysis of the selected strongly connected component and returns to step 305 to consider another strongly connected component in the netlist, if any more exist. The purpose of this threshold value is to limit the computational resources and execution time required by method 300.

Step 330 creates state machine information for the selected strongly connected component based upon the results of step 325. In an embodiment, the state machine information includes a list of the reachable states and their associated register values. The compilation software can use this information in the compilation of the user design to optimize this circuit elements of the selected strongly connected component. In further embodiments, a state transition diagram, such as that shown in FIG. 1, or an equivalent data structure is created in step 330 using the results of step 325.

Following step 330, method 300 returns to step 305 to search for state machines in other strongly connected components in the netlist. Optional step 335 optimizes the circuit based upon their associated state machine information. Step 335 can be performed following the analysis of each strongly connected component or following the analysis of all strongly connected components in the netlist.

In an embodiment, step 335 optimizes the strongly connected components associated with state machine information by setting the registers to all of their reachable states, as specified by the state machine information. The register values are then propagated through the state transition logic. The values of all of the circuit elements of the state transition logic in all of the reachable states are determined and stored. Using these values, step 335 can identify logic gates that are set at a constant value and are therefore redundant. By eliminating these redundant gates, the logic gates of the netlist can be simplified. Additionally, step 335 can identify sets of logic gates that can be replaced with simpler expressions. For example, by applying method 300 and step 335 to the state machine 250 in FIG. 2B, this circuit can be reduced to the state machine 200 in FIG. 2A.

In another embodiment, step 335 can evaluate alternate encoding schemes for the state machine. For example, by using a state transition diagram or other equivalent data structure determined in step 330, step 335 can select an alternative encoding scheme for the state machine and derive an equivalent hardware implementation. For example, if a one-hot encoded state machine outputs signals to a set of selectors, the state machine can be re-encoded in binary form. As a result, the selectors on the state machine outputs become binary multiplexers, which can be more efficiently implemented in some types of programmable devices. Conversely, state machines in binary encoding can be re-encoded in one-hot format or any other format to reduce the amount of state transition and output logic, which can decrease the resource requirements and improve execution speed.

In some circumstances, strongly connected components can include registers that are not part of state machines. For example, a strongly connected component can include a first set of registers that is part of a counter and feeds signals to a second set of registers forming a state machine. In these circumstances, the registers that are not part of the state machine can cause method 300 to identify a larger than necessary set of reachable states.

Figure 3B:
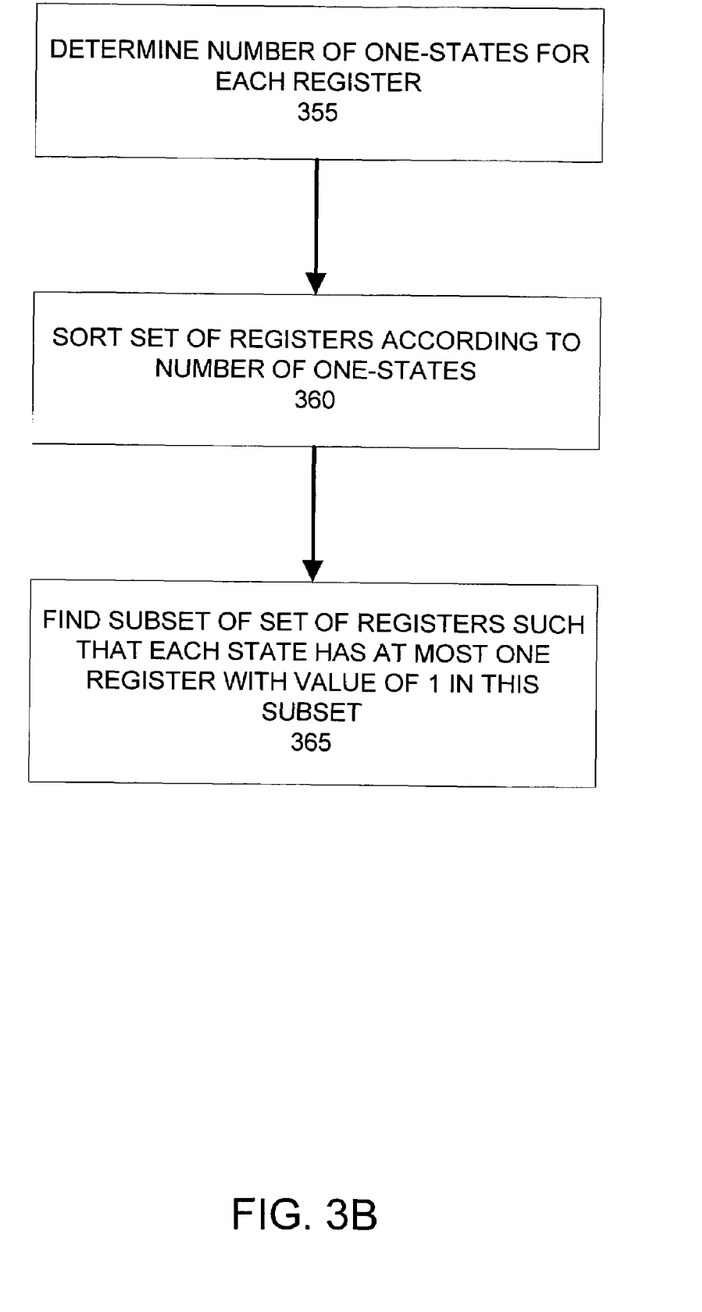

In a further embodiment, if the number of reachable states identified by step 325 exceeds a threshold value, method 350 of FIG. 3B attempts to identify a subset of the registers in the selected strongly connected component that has a smaller number of reachable states.

FIG. 3B illustrates a method 350 of identifying a subset of registers in the selected strongly connected component that has a smaller number of reachable states. In an embodiment, method 350 can be performed between steps 310 and 315 of method 300. In an embodiment, method 350 attempts to identify a subset of registers in the selected strongly connected component implementing a one-hot encoded state machine.

Step 355 determines the number of one-states for each register in the selected strongly connected component. A one-state for a register is a state in which the register has a value of one.

Step 360 sorts the set of registers according to their respective number of one-states. In an embodiment, the set of registers are sorted in ascending order of their number of one-states.

Step 365 identifies a subset of the sorted set of registers such that each state has at most one register in this subset with value one. For example, if the sorted set of registers are numbered 1 to N, then step 365 identifies the largest possible subset of registers, 1 to K, where K is less than or equal to N, such that for each state associated with the subset of registers 1 to K, there is at most one register having a value of one.

In an embodiment, step 365 can be performed iteratively by selecting subsets of the sorted set of registers in ascending order and identifying the states associated with the subset. For each of these states associated with the subset, step 365 determines if at most only one of the registers in the subset has a value of 1. If so, this subset is saved as the largest subset and step 365 adds the next register in the sorted set of registers to the subset and repeats the identification and evaluation of the associated states. Conversely, if step 365 determines that more than one register in the subset has a value of 1 for a given associated state, then step 365 discards the subset and identifies the previously stored largest subset of registers as the registers of a state machine.

Following step 365, an embodiment of the invention returns to step 315 of method 300 and analyzes and attempts to optimize the state machine and surrounding circuit elements as discussed above.

FIG. 6 illustrates a method 600 of determining the reachable states of a state machine according to an embodiment of the invention. Method 600 can be used by step 325 in an embodiment of the invention. Step 605 adds the initial state of a state machine to a list of new states. In an embodiment, the initial state of the state machine corresponds to the values of the registers of the state machine immediately following a system reset.

Step 610 selects one state from the list of new states. In an initial iteration of method 600, the selected state will be the initial state of the state machine; however, in subsequent iterations of method 600, the selected state will be a different state. Step 615 removes the selected state from the list of new states and adds the selected state to a list of analyzed states. The list of analyzed states is kept to ensure that states are not analyzed multiple times.

Step 620 sets the values of the registers in accordance with the selected state. Step 625 simulates all possible combinations of input values for the selected state and determines a set of one or more states following the selected state as a result of the possible combinations of input values. This set of states following the selected state is defined as a list of next states. Step 625 can use any logic or circuit analysis technique known in the art to determine the list of next states.

Step 630 evaluates each state in the list of next states. For each state in this list, step 630 determines if this state is in the list of analyzed states. If so, then this state is discarded. Step 630 also determines if the state in the list of next states is also in the list of new states. If a state in the list of next states is not in the list of new states and is also not in the list of analyzed states, then step 630 adds this state to the list of next states.

Step 635 determines if the list of new states is empty. If so, method 600 terminates and the list of analyzed states corresponds to the set of reachable states for the state machine. Conversely, if the list of new states is not empty, then method 600 returns to step 610 to analyze one of the remaining states in the list of new states.

In alternate embodiments of method 600, the input values and previous state associated with each state transition are stored in conjunction with each state on the list of next states. This additional information is transferred to the list of analyzed states if not duplicative. In this embodiment, the list of analyzed states will include the set of reachable states of the state machine and their associated state transitions, which enables embodiments of the invention to create a state machine diagram or other equivalent data structure from the hardware implementation of the state machine.

Figure 7:
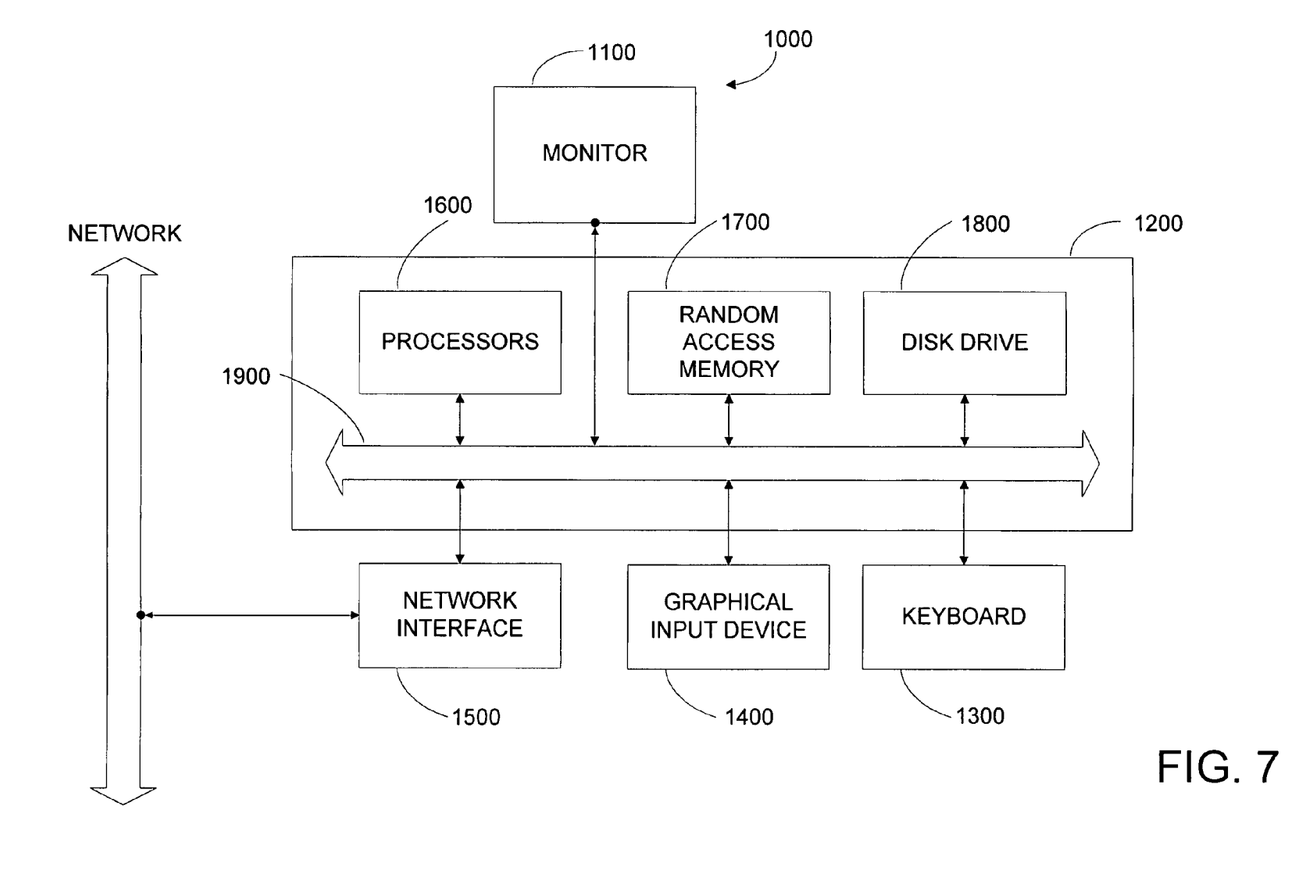
FIG. 7 illustrates a computer system suitable for implementing an embodiment of the invention.

FIG. 7 illustrates a computer system 1000 suitable for implementing an embodiment of the invention. Computer system 1000 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN).

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, and embodiments of the herein described invention. Further embodiments of computer 1200 can include specialized input, output, and communications subsystems for configuring, operating, testing, and communicating with programmable devices. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Figure 8:
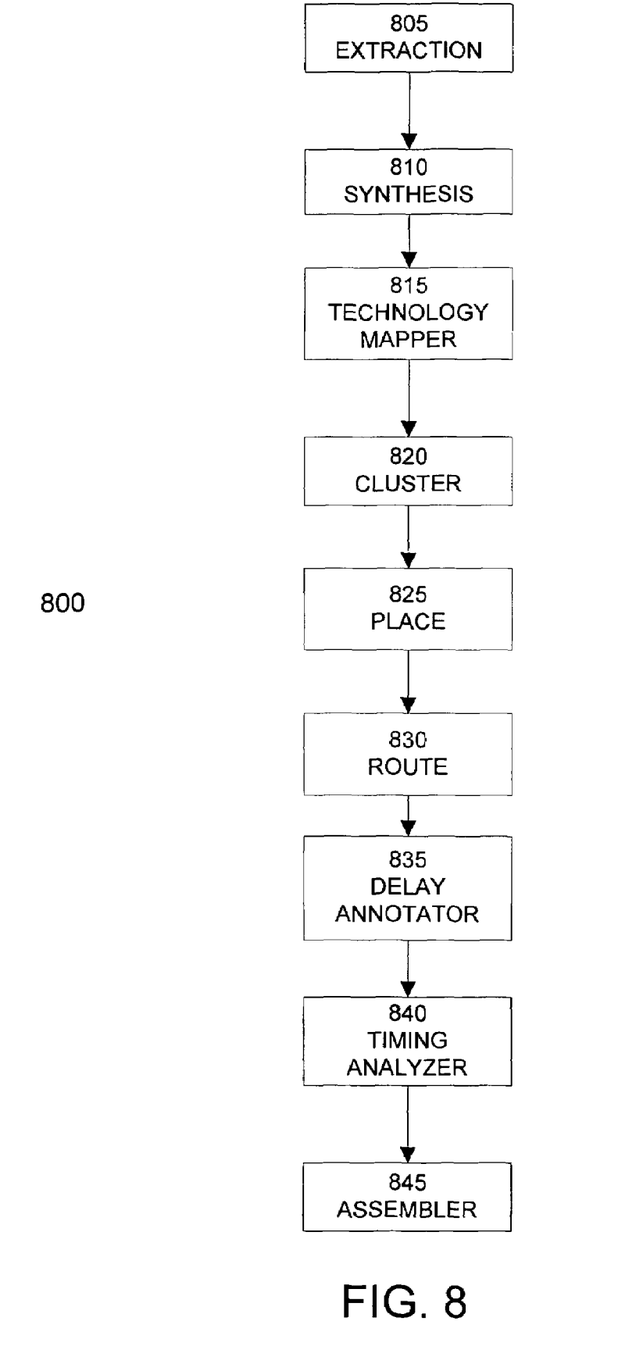
FIG. 8 illustrates a compilation process suitable for implementing an embodiment of the invention.

FIG. 8 illustrates a compilation process 800 suitable for implementing an embodiment of the invention. The compilation process 800 converts a user design into a programmable device configuration adapted to configure a programmable device to implement the user design. The extraction phase 805 converts a description of the user design, expressed for example in a hardware description language, into a register transfer layer description.

Synthesis phase 810 converts the register transfer layer description of the user design into a set of logic gates and applies optimizations to the logic gates. Technology mapping phase 815 subdivides the set of logic gates into a set of atoms, which are groups of logic gates matching the capabilities of the logic cells or other functional blocks of the programmable device. A given user design may be converted into any number of different sets of atoms, depending upon the underlying hardware of the programmable device used to implement the user design.

Following the technology mapping phase 815, the cluster phase 820 groups related atoms together into clusters. The placement phase 825 assigns clusters of atoms to locations on the programmable device. The route phase 830 determines the configuration of the configurable switching circuit of the programmable device used to connect the atoms implementing the user design.

The delay annotator phase 835 determines the signal delays for the set of atoms and their associated connections in the configurable switching circuit using a timing model of the programmable device. The timing analysis phase 840 determines the maximum operating speed of the programmable device when implementing the user design, for example by determining the portions of the user design have the largest signal delay.

The assembler phase 845 generates a set of configuration information specifying the configuration of the programmable device implementing the user design, including the configuration of each of the logic cells used to implement the user design and the configuration of the configurable switching circuit used to connect the logic cells. The assembler phase 845 can write the configuration information to a configuration file, which can then be used to configure one or more programmable devices to implement instances of the user design.

Embodiments of the method discussed above can applied during any compilation phase of compilation process 800 in which the logic of the user design is changed. This can include the synthesis phase 810 and a physical synthesis portion of the place and route phases 825 and 830.

Figure 9:
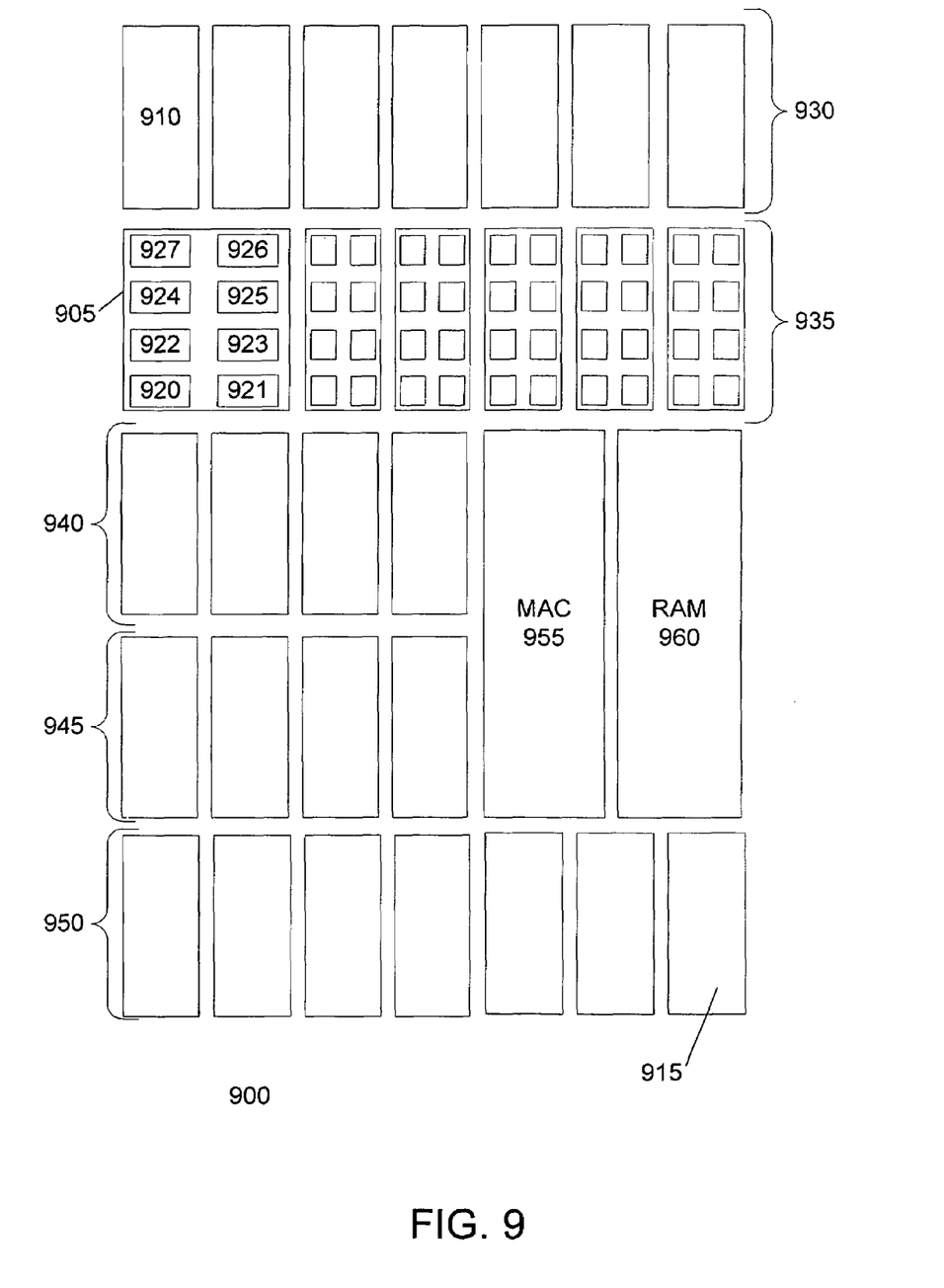
FIG. 9 illustrates a programmable device suitable for implementing a user design processed with an embodiment of the invention.

FIG. 9 illustrates a programmable device 900 suitable for implementing a user design processed with an embodiment of the invention. Programmable device 900 includes a number of logic array blocks (LABs), such as LABs 905, 910, 915. Each LAB includes a number of programmable logic cells using logic gates and/or look-up tables to perform a logic operation. LAB 905 illustrates in detail logic cells 920, 921, 922, 923, 924, 925, 926, and 927. Logic cells are omitted from other LABs in FIG. 9 for clarity. The LABs of device 900 are arranged into rows 930, 935, 940, 945, and 950. In an embodiment, the arrangement of logic cells within a LAB and of LABs within rows provides a hierarchical system of configurable connections, in which connections between logic cells within a LAB, between cells in different LABs in the same row, and between cell in LABs in different rows require progressively more resources and operate less efficiently.

In addition to logic cells arranged in LABs, programmable device 900 also include specialized functional blocks, such as multiply and accumulate block (MAC) 955 and random access memory block (RAM) 960. For clarity, the portion of the programmable device 900 shown in FIG. 9 only includes a small number of logic cells, LABs, and functional blocks. Typical programmable devices will include thousands or tens of thousands of these elements.

Further embodiments can be envisioned to one of ordinary skill in the art after reading the attached documents. For example, although the invention has been discussed with reference to programmable devices, it is equally applicable to logic minimization applications used to design any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method of identifying a one-hot encoded state machine in a netlist representing a user design, the method comprising:
   identifying a group of circuit elements in the netlist, wherein each circuit element has at least one feedback path, wherein a feedback path for a first circuit element in the group comprises an electrically traceable path from an output of the first circuit element through at least one other circuit element of the group to an input of the first circuit element;
   identifying a set of at least one register in the group of circuit elements;
   identifying a subset of the set of at least one register in the group of circuit elements, wherein identifying the subset includes:
      determining a number of one-states for each register in the set of at least one register in the group of circuit elements,
      sorting the set of at least one register in the group of circuit elements according to the number of one-states for each register, and
      identifying, from the sorted set of at least one register in the group of circuit elements, a subset comprising at most one register having a value of one for each state;
   identifying a set of at least one input for the registers of the subset;
   identifying a set of state transition logic in the group of circuit elements and associated with the subset of registers;
   computing a set of reachable states from an initial state for the subset of registers using the set of inputs and the set of state transition logic; and
   creating state machine information specifying at least a portion of the behavior of a state machine implemented by the group of circuit elements.

2. The method of claim 1, wherein the initial state is the value of the set of registers following a system reset.

3. A method of identifying a state machine in a netlist representing a user design, the method comprising:
   identifying a group of circuit elements in the netlist, wherein each circuit element has at least one feedback path, wherein a feedback path for a first circuit element in the group comprises an electrically traceable path from an output of the first circuit element through at least one other circuit element of the group to an input of the first circuit element;
   identifying a set of at least one register in the group of circuit elements;
   identifying a set of at least one input for the registers of the group of circuit elements;
   identifying a set of state transition logic in the group of circuit elements and associated with the set of registers;
   computing a set of reachable states from an initial state for the set of registers using the set of inputs and the set of state transition logic, wherein computing the set of reachable states from the initial state for the set of registers includes:
      (a) adding the initial state to a first list,
      (b) selecting one of the states from the first list,
      (c) removing the selected state from the first list and adding the selected state to a second list,
      (d) determining a set of potential next states following the selected state in response to a set of permutations of input values for the set of inputs,
      (e) for each of the set of potential next states, adding the potential next state to the first list if it is not on the first list or the second list, and
      (f) repeating (b), (c), (d), and (e) until the first list is empty; and
   creating state machine information specifying at least a portion of the behavior of a state machine implemented by the group of circuit elements.

4. The method of claim 3, wherein the set of inputs includes the output of at least one of the set of registers.

5. The method of claim 3, wherein the set of inputs includes a signal independent of the set of registers.

6. The method of claim 3, wherein the set of inputs are associated with a minimum input cut of the circuit elements connected with inputs of the set of registers in the strongly connected component.

7. The method of claim 6, wherein the set of state transition logic includes a portion of the netlist connected between the minimum input cut of the circuit elements and the inputs of the set of registers.

8. The method of claim 3, wherein computing a set of reachable states from the initial state of the set of registers includes simulating the operation of at least a portion of the circuit elements in response to a set of permutations of input values for the set of inputs.

9. The method of claim 3, wherein the state machine information includes the set of reachable states from an initial state for the set of registers.

10. The method of claim 9, wherein the state machine information includes state transitions associated with the set of reachable states.

11. The method of claim 3, further comprising:
   identifying a subset of the set of reachable states and corresponding values of the set of registers representing a one-hot encoded state machine.

12. The method of claim 3, further comprising:
   providing the state machine information for the set of registers to a phase of a compilation software application, wherein the phase of the compilation software application is adapted to optimize the netlist using the state machine information.

13. The method of claim 3, wherein the method is adapted to be performed by a phase of a compilation software application.

14. The method of claim 13, wherein the phase is a synthesis phase.

15. The method of claim 3, further comprising:
optimizing the netlist using the state machine information.

16. The method of claim 15, wherein optimizing the strongly connected component includes:
identifying redundant portions of the netlist that have constant values for two or more of the set of reachable states.

17. The method of claim 15, wherein optimizing the strongly connected component includes:
reencoding the state machine from a current encoding scheme to a different encoding scheme.

18. The method of claim 17, wherein the different encoding scheme is a binary encoding scheme.

19. The method of claim 17, wherein the different encoding scheme is a one-hot encoding scheme.

20. The method of claim 3, wherein the initial state is the value of the set of registers following a system reset.

21. An information storage medium comprising a plurality of instructions adapted to direct an information processing device to perform an operation comprising:
identifying a group of circuit elements in the netlist, wherein each circuit element has at least one feedback path, wherein a feedback path for a first circuit element in the group comprises an electrically traceable path from an output of the first circuit element through at least one other circuit element of the group to an input of the first circuit element;
identifying a set of at least one register in the group of circuit elements;
identifying a set of at least one input for the registers of the group of circuit elements;
identifying a set of state transition logic in the group of circuit elements and associated with the set of registers;
computing a set of reachable states from an initial state for the set of registers using the set of inputs and the set of state transition logic, wherein computing the set of reachable states from the initial state for the set of registers includes:
(a) adding the initial state to a first list,
(b) selecting one of the states from the first list,
(c) removing the selected state from the first list and adding the selected state to a second list,
(d) determining a set of potential next states following the selected state in response to a set of permutations of input values for the set of inputs,
(e) for each of the set of potential next states, adding the potential next state to the first list if it is not on the first list or the second list, and
(f) repeating (b), (c), (d), and (e) until the first list is empty; and
creating state machine information specifying at least a portion of the behavior of a state machine implemented by the group of circuit elements.

22. The information storage medium of claim 21, wherein the set of inputs includes the output of at least one of the set of registers.

23. The information storage medium of claim 21, wherein the set of inputs includes a signal independent of the set of registers.

24. The information storage medium of claim 21, wherein the set of inputs are associated with a minimum input cut of circuit elements connected with inputs of the set of registers in the strongly connected component.

25. The information storage medium of claim 24, wherein the set of state transition logic includes a portion of the netlist connected between the minimum input cut of circuit elements and the inputs of the set of registers.

26. The information storage medium of claim 21, wherein computing a set of reachable states from the initial state of the set of registers includes simulating the operation of at least a portion of the circuit elements in response to a set of permutations of input values for the set of inputs.

27. The information storage medium of claim 21, wherein the initial state is the value of the set of registers following a system reset.

28. The information storage medium of claim 21, wherein the state machine information includes the set of reachable states from an initial state for the set of registers.

29. The information storage medium of claim 28, wherein the state machine information includes state transitions associated with the set of reachable states.

30. The information storage medium of claim 21, further comprising:
identifying a subset of the set of reachable states and corresponding values of the set of registers representing a one-hot encoded state machine.

31. The information storage medium of claim 21, further comprising:
providing the state machine information for the set of registers to a phase of a compilation software application, wherein the phase of the compilation software application is adapted to optimize the netlist using the state machine information.

32. The information storage medium of claim 21, further comprising:
optimizing the netlist using the state machine information.

33. The information storage medium of claim 32, wherein optimizing the strongly connected component includes:
identifying redundant portions of the strongly connected component that have constant values for two or more of the set of reachable states.

34. An information storage medium comprising a plurality of instructions adapted to direct an information processing device to perform an operation comprising:
identifying a group of circuit elements in the netlist, wherein each circuit element has at least one feedback path, wherein a feedback path for a first circuit element in the group comprises an electrically traceable path from an output of the first circuit element through at least one other circuit element of the group to an input of the first circuit element;
identifying a set of at least one register in the group of circuit elements;
identifying a set of at least one input for the registers of the group of circuit elements;
identifying a set of state transition logic in the group of circuit elements and associated with the set of registers;
computing a set of reachable states from an initial state for the set of registers using the set of inputs and the set of state transition logic;
creating state machine information specifying at least a portion of the behavior of a state machine implemented by the group of circuit elements; and optimizing the netlist using the state machine information, wherein optimizing the group of circuit elements includes:
  evaluating the state machine for efficiency, wherein the evaluating comprises evaluating a size of the netlist, and evaluating a speed of the state machine and
  selecting between the current encoding scheme and the different encoding scheme based on the evaluated efficiency; and
  reencoding the state machine from a current encoding scheme to a different encoding scheme if the different encoding scheme is selected.

35. The information storage medium of claim 34, wherein the different encoding scheme is a binary encoding scheme.

36. The information storage medium of claim 34, wherein the different encoding scheme is a one-hot encoding scheme.

* * * * *